US008849642B2

(12) United States Patent
Gaudette

(10) Patent No.: US 8,849,642 B2
(45) Date of Patent: Sep. 30, 2014

(54) SIGNAL DEFINITIONS OR DESCRIPTIONS IN GRAPHICAL MODELING ENVIRONMENTS

(75) Inventor: Thomas Gaudette, Jamaica Plain, MA (US)

(73) Assignee: The Mathworks, Inc., Natick, MA (US)

(*) Notice: Subject to any disclaimer, the term of this patent is extended or adjusted under 35 U.S.C. 154(b) by 885 days.

(21) Appl. No.: 11/012,376

(22) Filed: Dec. 14, 2004

(65) Prior Publication Data

US 2006/0129369 A1    Jun. 15, 2006

(51) Int. Cl.
  *G06F 17/50*  (2006.01)
  *G06F 11/26*  (2006.01)
  *G06F 13/10*  (2006.01)

(52) U.S. Cl.
  CPC ............ *G06F 17/5009* (2013.01); *G06F 17/50* (2013.01); *G06F 11/261* (2013.01); *G06F 13/105* (2013.01)
  USPC ......................................................... 703/14

(58) Field of Classification Search
  USPC ......................................................... 703/14
  See application file for complete search history.

(56) References Cited

U.S. PATENT DOCUMENTS

| | | | |
|---|---|---|---|
| 6,272,451 B1 * | 8/2001 | Mason et al. .................... 703/13 |
| 6,425,762 B1 * | 7/2002 | Ernst ................................ 434/29 |
| 6,606,588 B1 * | 8/2003 | Schaumont et al. ............. 703/15 |
| 6,848,085 B2 * | 1/2005 | Panchul et al. ................ 716/102 |
| 6,993,469 B1 * | 1/2006 | Bortfeld .......................... 703/15 |
| 7,006,960 B2 * | 2/2006 | Schaumont et al. ............. 703/15 |
| 7,089,170 B2 * | 8/2006 | Buckmaster et al. ........... 703/14 |
| 7,107,202 B1 * | 9/2006 | Hegde et al. .................... 703/22 |
| 7,177,789 B1 * | 2/2007 | Miglianico .............. 318/400.33 |
| 7,191,111 B2 * | 3/2007 | Schuppe ......................... 703/13 |
| 7,316,009 B2 * | 1/2008 | Peck ............................. 717/138 |
| 7,366,651 B1 * | 4/2008 | Milne et al. ..................... 703/27 |
| 7,440,885 B2 * | 10/2008 | Garcia et al. .................... 703/25 |
| 7,472,054 B2 * | 12/2008 | Garcia et al. .................... 703/25 |
| 7,472,055 B2 * | 12/2008 | Garcia et al. .................... 703/25 |
| 7,490,032 B1 * | 2/2009 | Koh et al. ........................ 703/22 |
| 7,568,178 B2 * | 7/2009 | Moriat ............................ 716/56 |
| 7,627,462 B2 * | 12/2009 | Nightingale .................... 703/14 |
| 8,600,722 B1 * | 12/2013 | Chan et al. ...................... 703/14 |
| 2001/0049593 A1 * | 12/2001 | Mc Connell et al. ........... 703/14 |
| 2003/0005270 A1 | 1/2003 | Bartlett et al. |
| 2003/0016234 A1 * | 1/2003 | Mani et al. .................... 345/621 |
| 2003/0107595 A1 | 6/2003 | Ciolfi |
| 2004/0210592 A1 | 10/2004 | Ciolfi et al. |

(Continued)

OTHER PUBLICATIONS

Bellei et al. "Simulink-Based CoDesign and Cosimulation of a Common-Rail Injector Test Bench" Journal of Circuits, Systems, and Computers. Dec. 2002.*

(Continued)

*Primary Examiner* — Shambhavi Patel
(74) *Attorney, Agent, or Firm* — Harrity & Harrity, LLP

(57) ABSTRACT

Methods, system and computer program products are disclosed for providing a graphical modeling environment in which a graphical model is generated and executed. In the graphical modeling environment, elements are provided to define or describe signals associated with resources that are coupled to the graphical modeling environment. The high-level signal definition or description elements define or describe the signals associated with the resources regardless of the hardware of the resources. With the use of high-level signal definition or description elements, the users have the capability to deal with the signals transmitted to/from the resources without the specific knowledge of the hardware of the resources.

30 Claims, 4 Drawing Sheets

(56) References Cited

U.S. PATENT DOCUMENTS

| | | |
|---|---|---|
| 2004/0210831 A1 | 10/2004 | Feng et al. |
| 2005/0039160 A1* | 2/2005 | Santori et al. ................. 717/104 |
| 2005/0066305 A1* | 3/2005 | Lisanke ......................... 717/104 |
| 2009/0254323 A1* | 10/2009 | Moriat ............................... 703/7 |

OTHER PUBLICATIONS

Simulink: Model-Based and System-Based Design, Using Simulink. Version 4, 2001.*

Neag, I., et al. "Implementation architecture for IEEE standard P1641—signal and test definition using IVI technologies." *Proc. AUTOTESTCON*; 2004; pp. 174-180; San Antonio, TX.

International Search Report for Application No. PCT/US2005/044455, dated Apr. 18, 2006.

Communication under Rule 112 EPC for Application No. 05825994.6, dated Oct. 15, 2007.

IEEE Standards Activities Department, "Draft, Standard for Signal and Test Definition," IEEE P1641/D2 (2004).

The Institute of Electrical and Electronics Engineers, Inc., "Standard Test Language for All Systems—Common/Abbreviated Test Language for All Systems (C/ATLAS)", IEEE Std. 716-1995, Mar. 16, 1995, 606 pages.

* cited by examiner

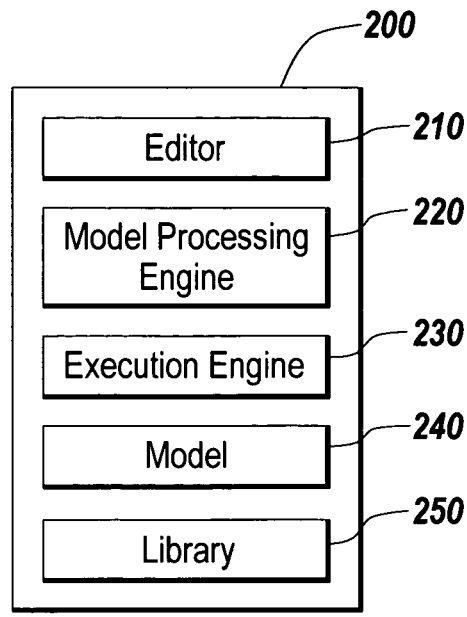
*Fig. 2*
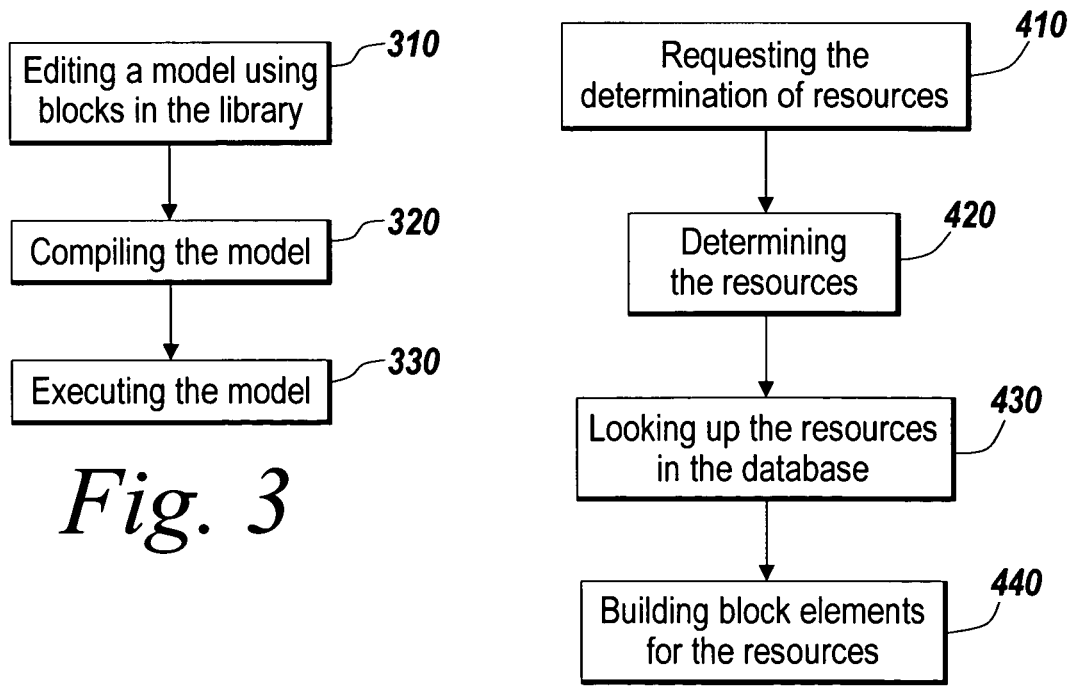
*Fig. 3*
*Fig. 4*

SIGNAL DEFINITIONS OR DESCRIPTIONS IN GRAPHICAL MODELING ENVIRONMENTS

FIELD OF THE INVENTION

The present invention relates generally to graphical modeling environments and more particularly to methods, systems and computer program products for providing signal definitions or descriptions in the graphical modeling environments.

BACKGROUND OF THE INVENTION

In an embedded control system, the interaction between the digital units, such as a controller, and the analog units, such as a controlled plant, of the system is critical. This interaction is accomplished generally by signal conditioning hardware, such as analog-to-digital (AD) and digital-to-analog (DA) converters. The signal conditioning hardware transforms low-power electrical signals in the operational range of logic signals (e.g., 0-5V) to high power signals to drive transducers, such as pumps, motors and valves, or vice versa.

'Smart sensors' (such as the IEEE 1451 standard) alleviate the burden of signal communication between the digital and analog units of a system. The smart sensor includes a microprocessor that contains information about the measurement of the sensor, such as the unit and accuracy of the measurement. The microprocessor then communicates directly in terms of signal values instead of having to convert them in binary representations that concur with the selected digitization and gain of the signal conditioning hardware.

In some text-based programming environments, users are allowed to use high-level signal definitions or descriptions instead of having to provide a sequence of hardware dependent commands to obtain a certain set of data. The high-level signal definitions or descriptions define or describe signals regardless of the hardware that generates or measures the signals. There are many standard signal definition or description languages available for traditional text-based programming languages that allow users to define or describe signals, apply signals, and measure signals. In those languages, users do not need to care about the hardware used to generate or measure the signals. For example, the Abbreviated Test Language for All Systems (ATLAS) allows standard signal operations, such as APPLY, MEASURE and VERIFY. Another example of the signal definition or description standard can be found in the "IEEE P1641" standard.

Recently, graphical programming environments are widely employed to model and simulate engineering and scientific systems, including embedded control systems. The graphical modeling environments provide tools for creating graphical models of the systems and for executing the graphical models. Exemplary graphical modeling environments can be found in time-based block diagram modeling environments, such as those found within Simulink\phi from The MathWorks, Inc. of Natick, Mass., state-based and flow diagram modeling environments, such as those found within Stateflow® from The MathWorks, Inc. of Natick, Mass., data-flow diagram modeling environments and Unified Modeling Language (UML) modeling environments. In these graphical modeling environments, the high-level definitions or descriptions of signals are also needed for the users to create and simulate the graphical models regardless of the hardware that generate or measure the signals.

SUMMARY OF THE INVENTION

The present invention provides a graphical modeling environment in which a graphical model is generated and executed. In the graphical modeling environment, elements are provided to represent physical signals associated with resources that are coupled to the graphical modeling environment. The elements include information to define or describe the physical signals associated with the resources regardless of the hardware of the resources. Users are allowed to use the high-level signal definition or description elements to generate and execute the graphical model. Users are able to create and execute the graphical model using the elements describing physical signals instead of incorporating elements that represent the hardware of the resources. With the use of high-level signal definition or description elements, the users have the capability to deal with the physical signals transmitted to/from the resources without the specific knowledge of the hardware of the resources.

In one aspect of the present invention, a method is provided for describing physical signals in a graphical modeling environment. The method includes the step of providing a graphical element for describing physical signals associated with a hardware component that transmits or receives the physical signals. The method also includes the step of incorporating the element in the model.

In another aspect of the present invention, a method is provided for defining signals for a model in a graphical modeling environment. The method includes the step of determining resources coupled to the modeling environment. The method also includes the step of generating graphical elements that describe signals associated with the resources. The graphical elements describe the signals associated with the resources regardless of hardware of the resources.

In another aspect of the present invention, a system is provided for describing signals for a model in a graphical modeling environment. The system includes resources coupled to the modeling environment. The system also includes a data structure for graphical elements that describe signals associated with the resources. The data structure describes the signals associated with the resources regardless of hardware of the resources.

In another aspect of the present invention, a computer program product is provided that holds instructions executable in a computer that provides an environment for modeling a system. The computer program product provides a graphical element that describes signals associated with a hardware component that transmits or receives the signals. The computer program product enables users to incorporate the element in the model.

In another aspect of the present invention, a computer program product is provided that holds instructions executable in a computer that provides an environment for modeling a system. The computer program product determines resources coupled to the modeling environment. The computer program product generates graphical elements that describe signals associated with the resources. The graphical elements describe the signals associated with the resources regardless of hardware of the resources.

BRIEF DESCRIPTION OF THE DRAWINGS

The aforementioned features and advantages, and other features and aspects of the present invention, will become better understood with regard to the following description and accompanying drawings, wherein:

FIG. 2 depicts an exemplary block diagram modeling environment provided in the illustrative embodiment of the present invention;

FIG. 3 is a flow chart showing an exemplary operation of the illustrative embodiment of the present invention for creating and simulating a model in the block diagram modeling environment;

FIG. 4 is a flow chart showing an exemplary operation of the illustrative embodiment of the present invention for generating signal definition or description elements in the block diagram modeling environment;

DETAILED DESCRIPTION

Figure 1:
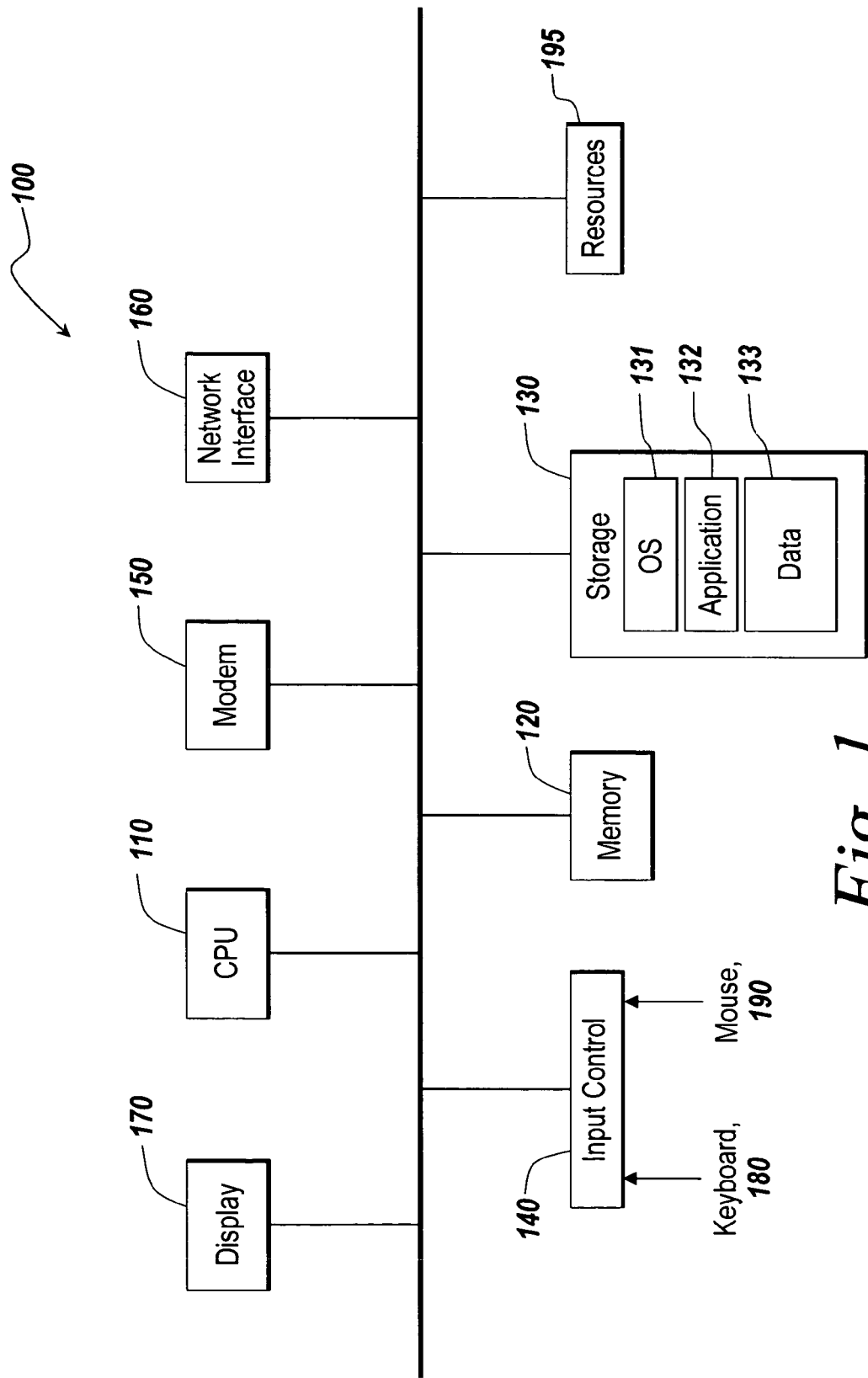
FIG. 1 shows an exemplary computational device suitable for practicing the illustrative embodiment of the present invention.

Certain embodiments of the present invention are described below. It is, however, expressly noted that the present invention is not limited to these embodiments, but rather the intention is that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The illustrative embodiment of the present invention provides a graphical modeling environment in which a graphical model is generated and simulated/executed. In the description of the illustrative embodiment, execution of the graphical model is also referred to as simulation. The illustrative embodiment will be described solely for illustrative purposes relative to a block diagram modeling environment. Although the illustrative embodiment will be described relative to the block diagram modeling environment, one of skill in the art will appreciate that the present invention may apply to other graphical modeling environments including data flow modeling environments and Unified Modeling Language (UML) modeling environments. One of skill in the art will also appreciate that the present invention may apply to other graphing tools including Microsoft Graph from Microsoft Corporation of Redmond, Wash.

An exemplary block diagram modeling environment can be found in Simulink® from The MathWorks, Inc. of Natick, Mass. Simulink® provides tools for modeling and simulating a variety of dynamic systems in one integrated, graphical environment. Simulink® enables users to design a block diagram for a target system, simulate the system's behavior, analyze the performance of the system, and refine the design of the system. Simulink® allows users to design target systems through a user interface that allows drafting of block diagram models of the target systems. All of the blocks in a block library provided by Simulink® and other programs are available to users when the users are building the block diagram of the target systems. Individual users may be able to customize this model block to: (a) reorganize blocks in some custom format, (b) delete blocks they do not use, and (c) add custom blocks they have designed. The blocks may be dragged through some human-machine interface (such as a mouse or keyboard) from the block library on to the window (i.e., model canvas). In Simulink®, there is also a textual interface with a set of commands that allow interaction with the graphical editor, such as the textual interface provided in MATLAB®. Using this textual interface, users may write special scripts that perform automatic editing operations on the block diagram. Simulink® also allows users to simulate the designed target systems to determine the behavior of the systems.

The illustrative embodiment will be described below relative a block diagram model in Simulink®. Nevertheless, those of skill in the art will appreciate that the present invention may be practiced relative to models implemented in other graphical modeling environments, including but not limited to LabVIEW from National Instruments Corporation of Austin, Tex., and Rational Rose from IBM of White Plains, N.Y.

In the illustrative embodiment, block elements are provided to define or describe signals associated with resources that are coupled to the block diagram modeling environment. Users are allowed to create and execute the block diagram model using the signal definition or description block elements. This high-level signal definition or description block element defines or describes the signals associated with the resources regardless of the hardware of the resources. Therefore, users are able to create and execute the block diagram model without incorporating block elements representing the hardware of the resources. With the use of high-level signal definition or description elements, the users can deal with the signals associated with the resources without the specific knowledge about the hardware of the resources.

FIG. 1 is an exemplary computational device 100 suitable for practicing the illustrative embodiment of the present invention, which provides a block diagram modeling environment. One of ordinary skill in the art will appreciate that the computational device 100 is intended to be illustrative and not limiting of the present invention. The computational device 100 may take many forms, including but not limited to a workstation, server, network computer, quantum computer, optical computer, bio computer, Internet appliance, mobile device, a pager, a tablet computer, and the like.

The computational device 100 may be electronic and include a Central Processing Unit (CPU) 110, memory 120, storage 130, an input control 140, a modem 150, a network interface 160, a display 170, etc. The CPU 110 controls each component of the computational device 100 to provide the block diagram modeling environment. The memory 120 temporarily stores instruction and data and provides them to the CPU 110 so that the CPU 110 operates the computational device 100 and runs the block diagram modeling environment. The storage 130 usually contains software tools for applications. The storage 130 includes, in particular, code 131 for the operating system (OS) of the device, code 132 for applications running on the operation system including applications for the block diagram modeling environment, and data 133 for the models created in the block diagram modeling environment.

The input control 140 may interface with a keyboard 180, a mouse 190, and other input devices. The computational device 100 may receive through the input control 140 input data necessary for creating models in the block diagram modeling environment, such as the selection of the attributes and operations of component blocks in the models. The computational device 100 may display in the display 170 user interfaces for the users to edit the models in the block diagram modeling environment. The network interface 160 and the MODEM 150 enable the computational device 100 to communicate with other electronic devices through communication networks, such as Internet, intranet, LAN (Local Area Network), WAN (Wide Area Network) and MAN (Metropolitan Area Network). The communication facilities may support the distributed implementations of the present invention.

The computational device 100, which runs the block diagram model, may be coupled to various resources 195. The resources 195 may include signal source devices from which data or signals are provided, such as function generators. The signal source devices may provide DC signals, AC signals, and many other waveforms of signals, for example, step signals, square wave signals, triangular signals, etc. The resources 195 may also include signal sink devices to which data or signals are provided, such as transducers including pumps, motors and valves. The resources 195 may include signal conditioning devices, such as an analog-to-digital (AD) converter that transforms high power signals to low-power logic signals in the range of, for example, 0-5V, and a digital-to-analog (DA) converter that transforms low-power logic signals to high power signals to drive the transducers. The signal conditioning devices can provide interfaces between a digital controller and an analog plant in an embedded control system. One of ordinary skill in the art will appreciate that the resources 195 described above are illustrative and any other resources can be coupled to the computational device 100.

FIG. 2 depicts an exemplary block diagram modeling environment 200 provided in the illustrative embodiment. The block diagram modeling environment 200 may include at least a model editor 210, a model processing engine 220 and a model execution engine 230. FIG. 3 is a flow chart showing an exemplary operation of the block diagram modeling environment 200 in the illustrative embodiment. Users may create their block diagram model 240 using the model editor 210 (step 310). The editor 210 allows users to perform such actions as draw, edit, annotate, save, and print out block diagram representations of systems. The block diagram model editor 210 may provide a graphical user interface (GUI) component that allows drafting of block diagram model 240 by the users. Methods used in editing are called by the block diagram editor 210 in order to render the block appropriately in the GUI of its parent block diagram. The block diagram model editor 210 may allow users to specify the parameters for the block when they use it in their models.

In creating the block diagram model 240, the users may use block elements provided in the block diagram modeling environment 200. The block elements may be contained in the library 250. An exemplary block library can be found in Blocksets from The MathWorks, Inc. of Natick, Mass., including Gauges Blockset, Aerospace Blockset, Signal Processing Blockset, etc. The users may also define their own block elements with desired functions and use them in the block diagram model 240. The users may define their own block elements using, for example, the S-function provided in Simulink®.

In the illustrative embodiment, the block diagram modeling environment 200 provides signal definition or description block elements to define or describe signals associated with the resources 195 that are coupled to the block diagram modeling environment 200. Users can create the block diagram model 240 using the signal definition or description block elements. The high-level signal definition or description block elements define or describe the signals associated with the resources 195 regardless of the hardware of the resources 195. Therefore, users are able to create and execute the block diagram model 240 without incorporating block elements representing the hardware of the resources. With the use of high-level signal definition or description elements, the users can deal with the signals associated with the resources without the specific knowledge about the hardware of the resources.

FIG. 4 is a flow chart showing an exemplary operation of the illustrative embodiment of the present invention for generating signal definition or description block elements in the block diagram modeling environment 200. Users may input a request for determining resources 195 coupled to the block diagram modeling environment 200 (step 410). For example, users may input a "getresources" command in a MATLAB® command line, which provides a foundation for Simulink®. In response to the request from the users, the block diagram modeling environment 200 determines the resources 195 coupled to the block diagram modeling environment 200 (step 420). The resources 195 coupled to the block diagram modeling environment 200 can be determined using many kinds of tools provided by various vendors, such as Instrument Control Toolbox and Data Acquisition Tools provided by The MathWorks, Inc. of Natick, Mass. Although the resources 195 are determined in response to the request from the users in the illustrative embodiment, one of skill in the art will appreciate that the determination can is made in a different manner, for example, when the block diagram modeling environment 200 is initialized or each time when a new resource is coupled to the block diagram modeling environment 200. It may be preferable to have the resources 195 determined during initialization time and not force the user to enter the "getresource" command.

If the resources 195 are determined, the block diagram modeling environment 200 looks up the resources 195 in the database of the block diagram modeling environment 200 (step 430). The block diagram modeling environment 200 searches a directory, or other suitable database, such as files or look up tables, for the resources 195. One of ordinary skill in the art will appreciate that users may download information for the resources 195 from a remote data center that retains data for the resources 195. Using available information for the resources 195, the block diagram modeling environment 200 can build the block elements for defining or describing signals associated with the resources 195 and store the block elements in the library 250 so that users can use the signal definition or description block elements in creating or editing the model 240 (step 440). XML can be used to map the resources 195 to the corresponding block elements for defining or describing signals associated with the resources 195. For example, the Instrument Definition XML from IEEE can help map the resource instrument to the corresponding block element.

Figure 5:
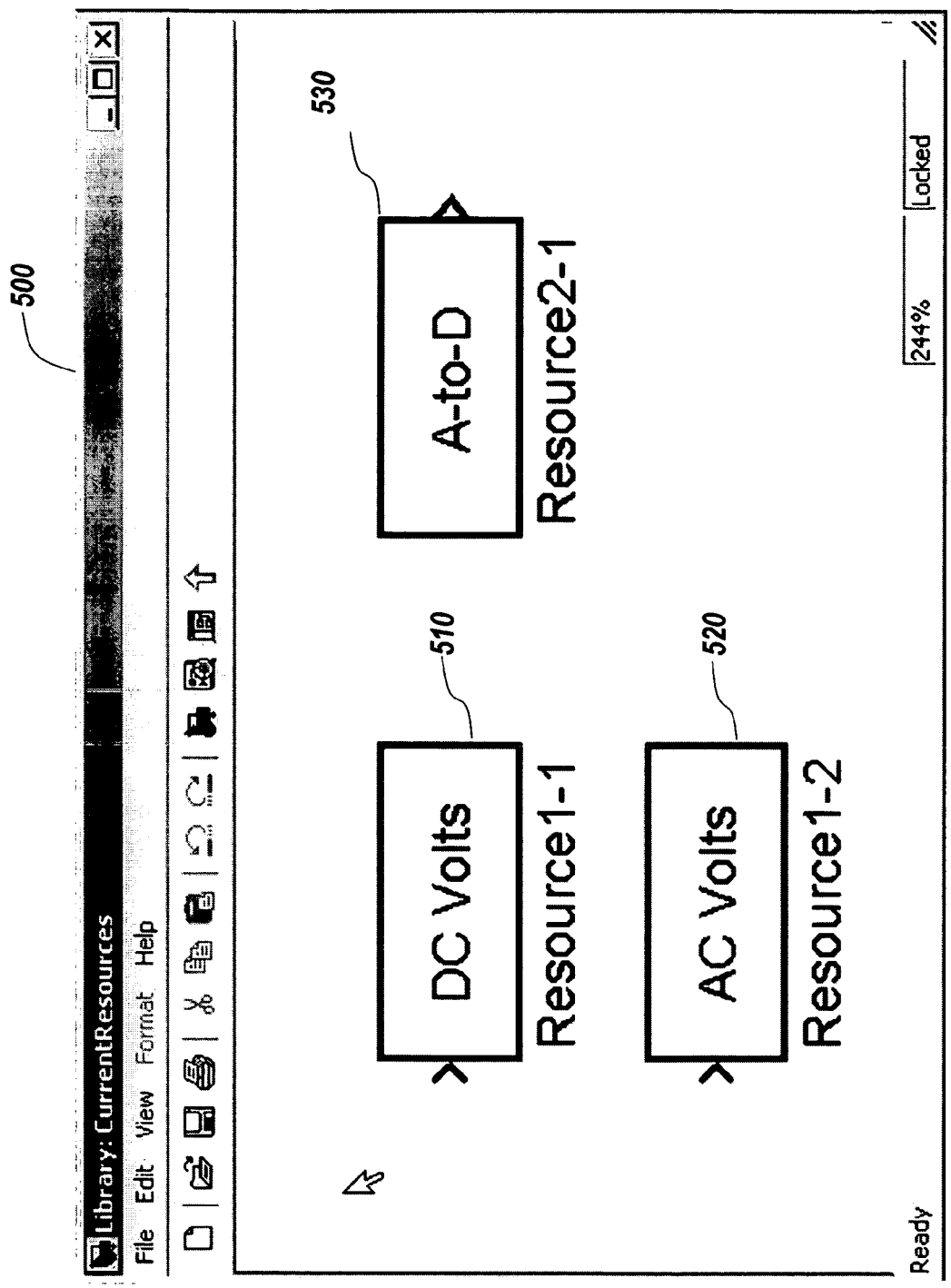
FIG. 5 displays a library that contains exemplary signal definition or description elements generated in the block diagram modeling environment.

FIG. 5 shows an exemplary library 500 that contains exemplary signal definition or description block elements 510 and 520 for the resources 195. The exemplary library 500 contains a DC voltage definition or description block 510 and an AC voltage definition or description block 520 for Resource 1-1 and Resource 1-2, respectively, which are coupled to the block diagram modeling environment 200. One of ordinary skill in the art will also appreciate that the block elements 510 and 520 are illustrative and the present invention may generate many other kinds of block elements describing different signals, such as an analog-to-digital converter block 530. The analog-to-digital (AD) converter block 530 may transform high power analog signals to their digital equivalent in the range of, for example, 0-5V. The analog-to-digital (AD) converter block 530 may define or describe the transformation necessary for the mapping from the high power signals.

The information obtained for the resources 195 from the database of the block diagram modeling environment 200 or from a remote data center is used to build the data structure of the block elements 510 and 520 for the resources 195. A typical base data-structure for the block elements 510 and 520 for the resources 195 may be represented as follows:

```
class Block {
  public:
        // Access methods for setting/getting block data
    ...
        // Methods for block editing
        virtual ErrorStatus BlockDrawIcon( );
        virtual BlockParameterData BlockGetParameterData( );
    ...
        // Methods for block compilation
    ...
        // Methods for block execution
    ..........................................
        virtual ErrorStatus BlockOutput( ) = 0;
        virtual ErrorStatus BlockDerivative( ) = 0;
        virtual ErrorStatus BlockUpdate( ) = 0;
    ...
  private:
        BlockGraphicalData blkGraphicalAttributes;
        BlockFunctionalData blkFunctionalAttributes;
        BlockCompiledData blkCompiledAttributes;
        BlockExecutionData blkExecutionData;
    ...
};
```

Although the example of the data structure above is written in C++, those skilled in the art will recognize that equivalent data structures written in other languages may also be used.

The block data structure has a set of associated methods that may be categorized as access methods to data fields, methods used in editing, methods used in compilation and methods used in execution. Access methods to data fields help in setting and getting the various data fields of the block. Methods used in editing are called by the block diagram editor in order to render the block appropriately in the GUI of its parent block diagram. For instance, this set of methods may include a BlockDrawIcon method that determines the shape the block icon has on the GUI. Methods used in compilation are methods that are called by the block diagram compilation engine. They help validate the connections of the block to other blocks on the block diagram. The methods used in execution include a number of different run-time methods that are required for execution. These include the BlockOutput, BlockUpdate, BlockDerivative methods that realize the Output, Update, and Derivative equations discussed earlier in the context of dynamic systems. In addition, to these methods Simulink includes several other run-time methods, such as the Jacobian, Projection, ZeroCrossings, Enable, Disable, Initialize, EvalParams (check and process parameters), and GetTimeOfNextHit methods. It should be noted that there is no explicit method for algebraic equations because these are represented and processed The data fields of the block data structure may include a graphical attributes field, a functional attributes field, a compiled attributes field and an execution data field.

The graphical attributes field is responsible for storing information relevant for graphical rendering of the block within its parent block diagram's GUI. Attributes specific to the block icon, such as font, color, name and icon-image, are stored in this field. It should be noted that modifying these attributes does not affect the dynamics of the model using this block.

The functional attributes field is responsible for specifying block attributes that may potentially affect the dynamics of the model using this block. These attributes are specified for the block as a whole and the input and output ports of the block. Examples of block attributes include block sample times and restrictive flags. Block sample times specify if the block corresponds to an elemental, continuous, discrete, or hybrid dynamic system. If the block is an elemental discrete-time system, then the attribute specifies the spacing between time instants at which the block response should be traced. A restrictive flag disallows the use of blocks in certain modeling contexts. For example, one may impose the restriction that there may only be one instance of given block in a model.

Attributes of block ports specify properties of the data that is either available or produced at that port. Block port attributes include dimensions, datatypes, sample rates, and direct feedthrough. Dimension attributes are individual dimensions of a multi-dimensional matrix that is used as a container for data elements. Datatype attributes are the datatype of each element of data in the data container. A complexity attribute is a flag to specify if each data element is real or complex. A sample rate attribute specifies how when the signal corresponding to an input or output port will be used. The port sample times may sometimes be used to implicitly infer the block's sample time. The direct feedthrough attribute is specified only for input ports and indicates whether or not the Output and/or GetTimeOfNextHit equations of the block are a function of the given input. This attribute helps in determining the sequence in which block methods should be executed while executing the block diagram.

The data structure of the block elements 510 and 520 also include attributes for describing signals associated with the resources 195 coupled to the block diagram modeling environment 200. The attributes of the signals may include the type of signals, such as voltage signals, defined with respect to time. One of ordinary skill in the art will appreciate that the attributes of the signals may define or describe other types of signals, such as signals representing events.

The DC voltage description block 510 may include following exemplary attributes depending on the waveform of the signal.

| WAVEFORM | ATTRIBUTES |
|---|---|
| Constant | Amplitude |
| Step | Amplitude, Start Time |
| Single Trapezoid | Amplitude, Start Time, Rise Time, Pulse Width, Fall Time |
| Single Ramp | Amplitude, Start Time, Rise Time |

For example, the constant signal has one property, the amplitude of the signal. The step signal makes transition from zero to a give level. Thus, the step signal has two properties, the start time of the transition and the final amplitude level. Before the start time, the value is zero and after the art time, the value is the amplitude. One of ordinary skill in the art will appreciate that the signals described above are illustrative and many other types of DC signals can be defined or described in other embodiments.

The AC voltage resource 520 may include following exemplary attributes depending on the shape of the signal.

| WAVEFORM | ATTRIBUTES |
|---|---|
| Sinusoidal | Amplitude, Frequency, Phase |
| Trapezoid | Amplitude, Period, Rise Time, Pulse Width, Fall Time |
| Ramp | Amplitude, Period, Rise Time |
| Triangle | Amplitude, Period, Duty Cycle |

-continued

| WAVEFORM | ATTRIBUTES |
|---|---|
| Square Wave | Amplitude, Period, Duty Cycle |
| Waveform Ramp | Amplitude, Period, Sampling Interval, Points |
| Waveform Step | Amplitude, Period, Sampling Interval, Points |

For example, a sinusoidal is a signal whereby the amplitude of the dependent variable is given by the formula:

$$a = A \sin(\omega t + \phi),$$

where A is the amplitude, $\omega$ is $2\pi \times$frequency, and $\phi$ is the initial phase angle. The sinusoidal signal has amplitude, frequency and phase as parameters. One of ordinary skill in the art will appreciate that the signals described above are illustrative and many other types of AC signals can be defined or described in other embodiments.

The block elements 510 and 520 may include values, such as a physical value and an associated dimension described by the units. The value property assigns the complete physical value to the attributes of the signals. Changing property values may not affect other property values. The following shows exemplary quantities and units.

| QUANTITY | UNIT |
|---|---|
| Current | Ampere (A) |
| Frequency | Hertz (Hz) |
| Power | Watt (W) |
| Time | Second/Minute/Hour (S/M/H) |
| Voltage | Volt (V) |

One of ordinary skill in the art will appreciate that the quantities and units of signals described above are illustrative and many other quantities and their units can be used to describe signals in other embodiments.

The compiled attributes field of the block data structure holds the attributes of the block and its ports that mirror the functional attributes listed above. This field is filled in during block diagram compilation by utilizing the functional attributes of the block in conjunction with the functional and compiled attributes of the blocks that are connected to it. This process of determining the compiled attributes from the functional attributes is termed attribute propagation. The execution data field is mainly responsible for storing the memory locations that are going to serve as sources for block inputs, outputs, states, parameters, and other work areas during execution of blocks.

The block elements 510 and 520 can be built using basic signal components that cannot be decomposed into simpler components. The block elements 510 and 520 may contain a single basic signal component or combined basic signal components to define more complex signals. The basic signal components can define static signals where the signals do not change over time. The signal component can also define dynamic signal where the value of the attributes or the signal changes while the signal is being used. The basic signal components are described in "IEEE P1641" standard in more detail with reference to a text-based programming language.

Figure 6:
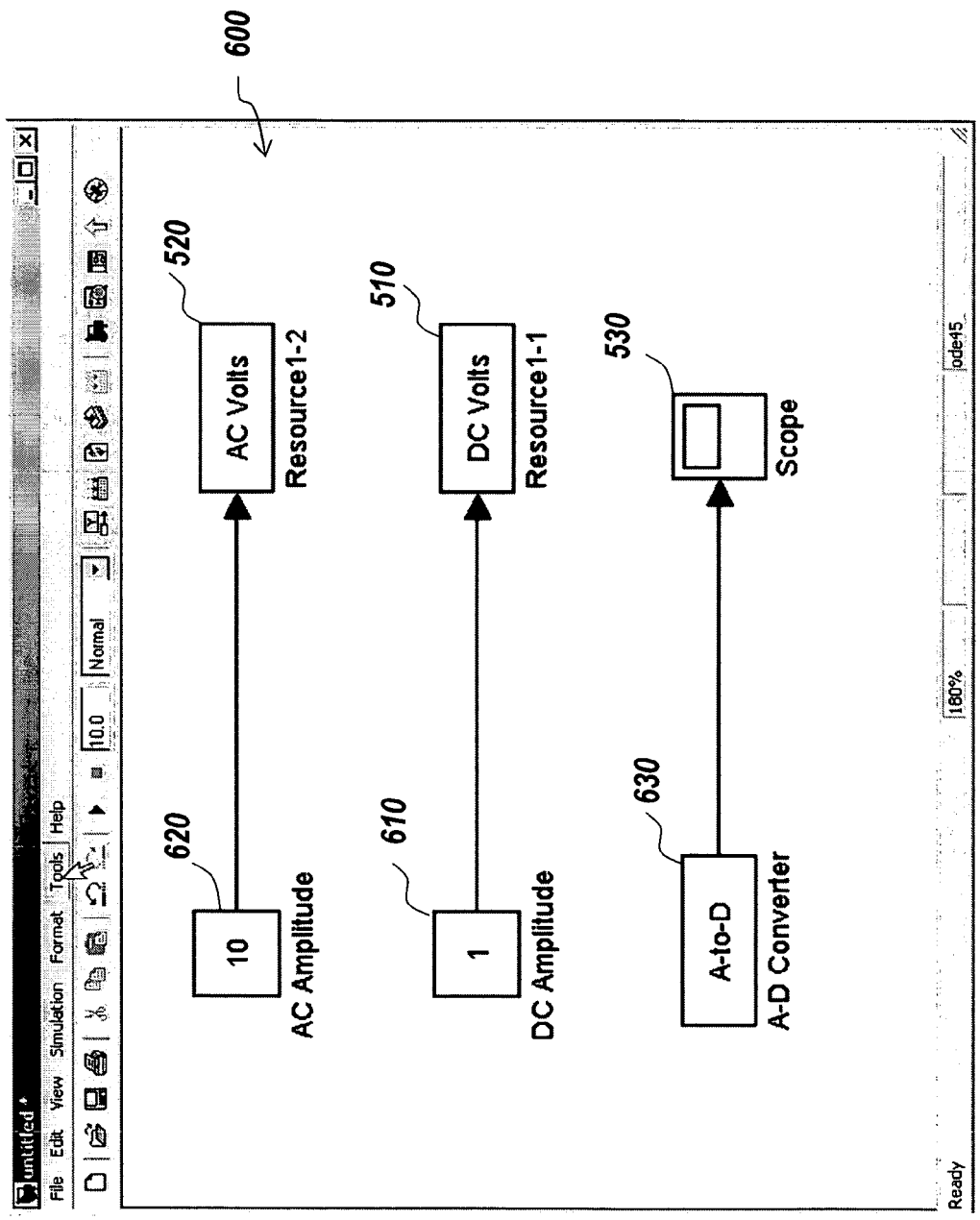
FIG. 6 is an exemplary model created in the block diagram modeling environment using the signal definition or description elements.

FIG. 6 is an exemplary model 600 created using the signal definition or description elements in the block diagram modeling environment 200. This simple model 600 includes the DC voltage definition or description block 510, the AC voltage definition or description block 520, and the analog-to-digital converter block 530, which are depicted in FIG. 5. The model 600 also includes DC Amplitude block 610, an AC Amplitude block 620 and a Scope block 630. The DC Amplitude block 610 may set the output level (1 in the model 600) of the DC power generator represented by the DC voltage definition or description block 510. In a like manner, the AC Amplitude block 620 may set the output level (10 in the model 600) of the AC power generator represented by the AC voltage definition or description block 520. The output signal or data of the analog-to-digital converter represented by the analog-to-digital converter block 530 is displayed in the Scope block 630.

The DC voltage definition or description block 510, the AC voltage definition or description block 520 and the analog-to-digital converter block 530 describe signals associated with resources, such as a DC signal generator, an AC signal generator and an analog-to-digital converter, that are coupled to the block diagram modeling environment 200. The DC voltage definition or description block 510, the AC voltage definition or description block 520 and the analog-to-digital converter block 530 describe the signals in a manner that is independent of the hardware of the DC signal generator, the AC signal generator and the analog-to-digital converter, respectively. For example, the DC voltage description block 510 may describe signals produced by 33220A power supply from Agilent Technologies or by DAS 16/16-AO board from Measurement Computing Corp. Because the DC voltage description block 510, the AC voltage definition or description block 520 and the analog-to-digital converter block 530 can describe signals regardless of the hardware of the resources, the users can use the DC voltage description block 510, the AC voltage definition or description block 520 and the analog-to-digital converter block 530 without any knowledge about the hardware of the resources associated with the signals.

Referring back to FIG. 3, when the block diagram model 240 is created or edited, the block diagram model 240 is compiled and executed by the model processing engine 220 and the model execution engine 230, respectively. The model processing engine 220 carries out the task of compiling and linking the block diagram to produce an "in-memory executable" version of the model that is used for generating code and/or simulating or linearizing a block diagram model (step 320). The compilation stage involves preparing data structures and evaluating parameters, configuring and propagating block characteristics, determining block connectivity, and performing block reduction and block insertion. In the link stage, the model processing engine 220 uses the result of the compiled stage to allocate memory needed for the execution of the various components of the block diagram. The linking stage also produces block method execution lists which are used by the simulation or linearization of the block diagram. After linking has been performed, the model processing engine 220 may generate code. If this stage is performed, then the stages that follow use the generated code during the execution of the block diagram. If this stage is skipped completely, then the execution engine 230 uses an interpretive mode of execution for the block diagram (step 330).

It will thus be seen that the invention attains the objectives stated in the previous description. Since certain changes may be made without departing from the scope of the present invention, it is intended that all matter contained in the above description or shown in the accompanying drawings be interpreted as illustrative and not in a literal sense. For example, the illustrative embodiment of the present invention may be practiced in any other graphical modeling environments, such as a state-based modeling environment. Practitioners of the art will realize that the sequence of steps and architectures depicted in the figures may be altered without departing from the scope of the present invention and that the illustrations contained herein are singular examples of a multitude of possible depictions of the present invention.

I claim:

1. A method comprising:
   determining a hardware component coupled to a graphical modeling environment,
      determining the hardware component being performed by a device;
   obtaining information identifying one or more hardware characteristics of the hardware component based on the hardware component being coupled to the graphical modeling environment,
      obtaining the information being performed by the device;
   generating a block, associated with the hardware component, based on a first method,
      the first method being associated with setting one or more data fields,
         the one or more data fields being associated with the block, and
      the first method being determined based on the information,
      generating the block being performed by the device, and
      the block including:
         one or more block attributes for describing, in the graphical modeling environment, one or more signals transmitted between the hardware component and the graphical modeling environment, and
         a high-level signal definition of the one or more signals,
            the high-level signal definition defining the one or more signals independently of the one or more hardware characteristics of the hardware component;
   storing the block in a block library associated with the graphical modeling environment,
      storing the block being performed by the device;
   generating a graphical model, that includes the block, in the graphical modeling environment,
      generating the graphical model being performed by the device;
   compiling, based on a second method, the graphical model,
      the second method being associated with compiling the graphical model,
      the second method being determined based on the information, and
      compiling the graphical model being performed by the device;
   executing, based on a third method, the compiled graphical model to simulate a behavior of a system represented by the graphical model,
      the third method being associated with executing the graphical model,
      the third method being determined based on the information,
      executing the compiled graphical model being performed by the device, and
      the graphical model interfacing, via the block, with the one or more signals using the high-level signal definition provided by the block during an execution of the compiled graphical model; and
   outputting, via the graphical modeling environment, a result of the execution,
      outputting the result being performed by the device.

2. The method of claim 1, where the graphical model comprises a block diagram model.

3. The method of claim 1, further comprising:
   determining, based on the information, one or more attributes of the one or more signals that affect, during the execution of the compiled graphical model, a dynamics of the graphical model,
      where the one or more attributes include one or more of:
         an attribute indicating a sample time associated with the one or more signals,
         an attribute indicating property of data available at a port of the block, or
         an attribute indicating whether a data element is real or complex.

4. The method of claim 1, where the block describes the one or more signals with respect to time.

5. The method of claim 1, where the block describes the one or more signals with respect to frequency.

6. The method of claim 4, where the block further describes one or more static signals that do not change with respect to time.

7. The method of claim 4, where the block further describes one or more dynamic signals that change with respect to time.

8. A method comprising:
   receiving an input for determining resources coupled to a graphical modeling environment,
      receiving the input being performed by a device;
   determining, based on the input, that one or more resources are coupled to the graphical modeling environment,
      determining that the one or more resources are coupled to the graphical modeling environment being performed by the device;
   determining information about hardware characteristics of the one or more resources coupled to the graphical modeling environment,
      determining the information about the hardware characteristics of the one or more resources being performed by the device;
   generating one or more blocks, associated with the one or more resources, based on a first method,
      the first method being associated with setting one or more data fields,
         the one or more data fields being associated with the one or more blocks,
      the first method being determined based on the information about the hardware characteristics of the one or more resources,
      generating the one or more blocks being performed by the device, and
      the one or more blocks including:
         one or more block attributes describing, in the graphical modeling environment, one or more signals transmitted between the graphical modeling environment and the one or more resources, and
         a high-level signal definition of the one or more signals,
            the high-level signal definition defining the one or more signals independently of the hardware characteristics of the one or more resources;
   incorporating the one or more blocks into a graphical model in the graphical modeling environment,
      incorporating the one or more blocks being performed by the device;
   compiling, based on a second method, the graphical model,
      the second method being associated with compiling the graphical model,
      the second method being determined based on the information about the hardware characteristics of the one or more resources, and compiling the graphical model being performed by the device;

executing, based on a third method, the compiled graphical model to simulate a behavior of a system represented by the graphical model,
the third method being associated with executing the graphical model,
the third method being determined based on the information about the hardware characteristics of the one or more resources,
executing the compiled graphical model being performed by the device, and
the graphical model interfacing, via the one or more blocks, with the one or more signals using the high-level signal definition provided by the one or more blocks during an execution of the compiled graphical model; and outputting, via the graphical modeling environment, a result of the execution,
outputting the result being performed by the device.

9. The method of claim 8, where the graphical model comprises a block diagram model.

10. The method of claim 8, where determining the one or more resources includes:
determining one or more hardware resources coupled to the graphical modeling environment.

11. The method of claim 8, where the one or more blocks comprise one or more attributes of the one or more signals.

12. The method of claim 11, where generating the one or more blocks includes:
generating the one or more blocks further based on the one or more block attributes of the one or more signals.

13. A system comprising:
a storage device; and
a processor to:
determine one or more resources coupled to a graphical modeling environment,
the one or more resources having hardware characteristics;
obtain information about the hardware characteristics of the one or more resources;
generate a block, associated with the one or more resources, based on a first method,
the first method being associated with setting one or more data fields,
the one or more data fields being associated with the block,
the second method being determined based on the information about the hardware characteristics of the one or more resources, and
the block including:
one or more block attributes describing, in the graphical modeling environment, one or more signals transmitted between the graphical modeling environment and the one or more resources, and
a high-level signal definition of the one or more signals transmitted between the graphical modeling environment and the one or more resources,
the high-level signal definition defining the one or more signals independently of the hardware characteristics of the one or more resources,
store the generated block, including the one or more block attributes describing the one or more signals, in a block library;

incorporate the block into a graphical model in the graphical modeling environment;
compile, based on a second method, the graphical model,
the second method being associated with compiling the graphical model, and
the second method being determined based on the information about the hardware characteristics of the one or more resources;
execute, based on a third method, the compiled graphical model to simulate a behavior of a system represented by the graphical model,
the third method being associated with executing the graphical model,
the third method being determined based on the information about the hardware characteristics of the one or more resources, and
the graphical model interfacing, via the block, with the one or more signals using the high-level signal definition provided by the block during an execution of the compiled graphical model; and
store a result of the execution of the graphical model in the storage device.

14. The system of claim 13, where the graphical model comprises a block diagram model.

15. The system of claim 13, where the high-level signal definition of the one or more signals describes the one or more signals with respect to time.

16. The system of claim 13, where the high-level signal definition of the one or more signals describes a signal that changes with respect to time and another signal that does not change with respect to time.

17. The system of claim 15, where the high-level signal definition of the one or more signals changes with respect to time.

18. A non-transitory computer-readable medium storing instructions, the instructions comprising:
one or more instructions that, when executed by a computing device, cause the computing device to:
determine a hardware component coupled to a graphical modeling environment,
the hardware component having hardware characteristics;
determine information about the hardware characteristics of the hardware component;
generate a graphical model element, associated with the hardware component, based on a first method,
the first method being associated with setting one or more fields,
the one or more fields being associated with the graphical model element,
the first method being determined based on the information, and
the graphical model element including:
one or more attributes describing, in the modeling environment, one or more signals transmitted between the hardware component and the graphical modeling environment, and
a high-level signal definition of the one or more signals,
the high-level signal definition defining the one or more signals independently of the hardware characteristics of the hardware component;
store the graphical model element, including the one or more attributes describing the one or more signals, in a library associated with the graphical modeling environment;

incorporate the block into a graphical model in the graphical modeling environment;
compile, based on a second method, the graphical model,
the second method being associated with compiling the graphical model, and
the second method being determined based on the information;
execute, based on a third method, the compiled graphical model,
the third method being associated with executing the graphical model,
the third method being determined based on the information, and
the graphical model interfacing with the one or more signals using the high-level signal definition provided by the graphical model element during an execution of the graphical model; and
store a result of the execution of the graphical model in a memory.

19. The non-transitory computer-readable medium of claim 18, where the graphical model comprises a block diagram model.

20. The non-transitory computer-readable medium of claim 18, where the attributes include information describing a sample time associated with the one or more signals.

21. The non-transitory computer-readable medium of claim 18, where the graphical model element describes the one or more signals with respect to time.

22. The non-transitory computer-readable medium of claim 21, where the graphical model element describes one or more static signals that do not change with respect to time.

23. The non-transitory computer-readable medium of claim 21, where the graphical model element describes one or more dynamic signals that change with respect to time.

24. A non-transitory computer-readable medium storing instructions, the instructions comprising:
one or more instructions that, when executed by a computing device, cause the computing device to:
obtain information related to hardware characteristics of one or more resources coupled to a graphical modeling environment;
generate a block, associated with the one or more resources, based on a first method,
the first method being associated with setting one or more data fields,
the one or more data fields being associated with the block,
the first method being determined based on the information related to the hardware characteristics of the one or more resources, and
the block including:
information identifying one or more block attributes,
the information identifying the one or more block attributes describing, with respect to the graphical modeling environment, one or more signals transmitted between the block and the one or more resources, and
a high-level signal definition of the one or more signals,
the high-level signal definition defining the one or more signals independently of the hardware characteristics of the one or more resources;
incorporate the block into a graphical model in the graphical modeling environment;
compile, based on a second method, the graphical model,
the second method being associated with compiling the graphical model, and
the second method being determined based on the information related to the hardware characteristics of the one or more resources;
execute, based on a third method, the compiled graphical model to simulate a behavior of a system represented by the graphical model,
the third method being associated with executing the graphical model,
the third method being determined based on the information related to the hardware characteristics of the one or more resources, and
the graphical model interfacing, via the block, with the one or more signals using the high-level signal definition provided by the block during an execution of the compiled graphical model; and
store a result of the execution of the graphical model in a storage device.

25. The non-transitory computer-readable medium of claim 24, where the graphical model comprises a block diagram model.

26. The non-transitory computer-readable medium of claim 24, where the instructions further comprise:
one or more instructions that when executed by the computing device, cause the computing device to:
receive, via the graphical modeling environment, a request for determining the one or more resources coupled to the graphical modeling environment; and
where the one or more instructions to obtain the information related to the hardware characteristics of the one or more resources include:
one or more instructions that, when executed by the computing device, cause the computing device to obtain the information related to the hardware characteristics of the one or more resources based on the request.

27. The non-transitory computer-readable medium of claim 24, where the one or more attributes include information identifying a sample time associated with the one or more signals.

28. The non-transitory computer-readable medium of claim 27, where the one or more instructions to generate the block include:
one or more instructions that, when executed by the computing device, cause the computing device to generate the block further based on the sample time associated with the one or more signals.

29. A method comprising:
generating an executable graphical model in a graphical modeling environment,
generating the executable graphical model being performed by a device, and
the graphical modeling environment being coupled to one or more resources;
obtaining information identifying a hardware characteristic associated with the one or more resources,
obtaining the information identifying the hardware characteristic associated with the one or more resources being performed by the device;
generating a block, associated with the one or more resources, based on a first method,
the first method being associated with setting one or more data fields, the one or more data fields being associated with the block,
the first method being determined based on the information identifying the hardware characteristics associated with the one or more resources, and
the block including:
   information identifying one or more block attributes describing, in the graphical modeling environment, one or more signals transmitted between the one or more resources and the graphical modeling environment, and
   a high-level signal definition of the one or more signals,
      the high-level signal definition defining the one or more signals independently of the hardware characteristic associated with the one or more resources;
incorporating the block into the executable graphical model,
   incorporating the block being performed by the device;
compiling, based on a second method, the executable graphical model,
   the second method being associated with compiling the executable graphical model,
   the second method being determined based on the information identifying the hardware characteristic associated with the one or more resources, and
   compiling the executable graphical model being performed by the device;
executing, in the graphical modeling environment and based on a third method, the compiled graphical model to simulate a behavior of a system represented by the executable graphical model,
   the third method being associated with executing the executable graphical model,
   the third method being determined based on the information identifying the hardware characteristic associated with the one or more resources,
   executing the compiled graphical model being performed by the device, and
   the graphical model interfacing, via the block, with the one or more signals using the high-level signal definition in the block during an execution of the compiled graphical model in the graphical modeling environment; and storing a result of the execution in a memory,
   storing the result being performed by the device.
30. A system comprising;
a memory; and
a processor to:
   generate a graphical model in a graphical modeling environment,
      the graphical modeling environment being coupled to one or more resources;
   determine information about hardware characteristics of the one or more resources;
   generate a block, associated with the one or more resources, based on a first method,
      the first method being associated with setting one or more data fields,
      the first method being determined based on the information about the hardware characteristics, and
      the block including:
         one or more block attributes describing, in the graphical modeling environment, one or more signals transmitted to or received from the one or more resources, via the block, and
         a high-level signal definition of the one or more signals,
            the high-level signal definition defining the one or more signals independently of the hardware characteristics of the one or more resources;
   incorporate the block into the graphical model;
   execute, based on a second method, the graphical model to simulate a behavior of a system represented by the graphical model,
      the second method being associated with executing the graphical model,
      the second method being determined based on the information about the hardware characteristics, and
      the graphical model interfacing, via the block, with the one or more signals transmitted to or received from the one or more resources using the high-level signal definition during the execution of the graphical model in the graphical modeling environment; and
   output a result of executing the graphical model.

* * * * *